(12) United States Patent
Jensen et al.

(10) Patent No.: US 11,395,429 B2
(45) Date of Patent: Jul. 19, 2022

(54) WEDGE CLAMP FOR CIRCUIT BOARD

(71) Applicant: Simon Industries, Inc., Raleigh, NC (US)

(72) Inventors: Moses Ray Jensen, Austin, TX (US); Mark Roger Pelillo, Wake Forest, NC (US); James Christopher Caylor, Flower Mound, TX (US); David R F Stone, Raleigh, NC (US)

(73) Assignee: SIMON INDUSTRIES, INC., Raleigh, NC (US)

( * ) Notice: Subject to any disclaimer, the term of this patent is extended or adjusted under 35 U.S.C. 154(b) by 381 days.

(21) Appl. No.: 16/736,240

(22) Filed: Jan. 7, 2020

(65) Prior Publication Data

US 2020/0229316 A1 Jul. 16, 2020

Related U.S. Application Data

(60) Provisional application No. 62/792,001, filed on Jan. 14, 2019.

(51) Int. Cl.
*H05K 7/14* (2006.01)
*F16B 2/04* (2006.01)
*F16B 2/14* (2006.01)

(52) U.S. Cl.
CPC ............ *H05K 7/1407* (2013.01); *F16B 2/04* (2013.01); *F16B 2/14* (2013.01)

(58) Field of Classification Search
CPC ..... F16B 2/02; F16B 2/04; F16B 2/14; H05K 7/14; H05K 7/1401; H05K 7/1402; H05K 7/1404; H05K 7/1407
See application file for complete search history.

(56) References Cited

U.S. PATENT DOCUMENTS 3,970,198 A 7/1976 Prater
4,354,770 A * 10/1982 Block .................... F16B 2/14
361/801

(Continued)

FOREIGN PATENT DOCUMENTS

DE 7016769 U 8/1970
WO WO 2006/129004 A2 7/2006

OTHER PUBLICATIONS

Birtcher Wedge-Lok Series 40-5: Five-Piece, .225x.260 specs, birtcherproducts.com, pp. 18 & 19, believed to be sold in the U.S. before Dec. 2017.

(Continued)

*Primary Examiner* — Jonathan P Masinick
(74) *Attorney, Agent, or Firm* — Crowell & Moring LLP (57) ABSTRACT

A releasable clamping device is provided. The device includes a plurality of wedge members that slidably are disposed upon a carrier, with an input disposed in conjunction with a first wedge member. The input interacts with a projection and when the input is moved the first wedge members slides along the carrier. Motion of the first wedge member causes vertical motion of the second and fourth wedge members, which in combination cause the thickness of the releasable clamping device to increase, which frictionally retains the carrier and associated components thereon (such as a PCB) within a housing. The input may be moved in an opposite direction which causes the first wedge member to slide along the carrier in an opposite direction and causes the second and fourth wedge members to vertically move toward the carrier thereby narrowing the overall thickness of the device to allow removal of the carrier.

12 Claims, 10 Drawing Sheets

(56) References Cited

U.S. PATENT DOCUMENTS

| | | | | |
|---|---|---|---|---|
| 4,480,287 A * | 10/1984 | Jensen | H05K 7/1404 361/715 |
| 4,775,260 A * | 10/1988 | Kecmer | H05K 7/1404 361/801 |
| 4,819,713 A * | 4/1989 | Weisman | H05K 7/1404 174/16.3 |
| 4,824,303 A | 4/1989 | Dinger | |
| 4,953,059 A * | 8/1990 | McNulty | H05K 7/1404 361/801 |
| 5,220,485 A * | 6/1993 | Chakrabarti | H05K 7/1404 361/720 |
| 5,224,016 A * | 6/1993 | Weisman | H05K 7/1404 361/728 |
| 5,407,297 A | 4/1995 | Hulme et al. | |
| 5,779,388 A * | 7/1998 | Yamamoto | H05K 7/1404 403/374.1 |
| 6,615,997 B2 | 9/2003 | Danello et al. | |
| 6,687,130 B2 | 2/2004 | Adams, Sr. et al. | |
| 7,046,506 B2 | 5/2006 | Olzak | |
| 7,543,415 B2 * | 6/2009 | Svendsen | E04H 12/2269 52/298 |
| 8,045,332 B2 * | 10/2011 | Lee | H05K 7/1404 361/759 |
| 8,223,497 B2 * | 7/2012 | Sundstrom | H05K 7/20536 361/720 |
| 8,456,846 B2 | 6/2013 | Mosier et al. | |
| 9,655,269 B2 * | 5/2017 | Paykarimah | H05K 7/1427 |
| 9,844,161 B2 * | 12/2017 | Gilmore | H05K 7/1404 |
| 10,034,403 B1 * | 7/2018 | Flannery | F16B 2/14 |
| 10,182,509 B1 | 1/2019 | Jensen et al. | |
| 10,433,449 B2 * | 10/2019 | Kilroy | H05K 7/1404 |
| 10,488,167 B2 * | 11/2019 | Ockfen | F42B 15/34 |
| 11,160,184 B2 * | 10/2021 | Cooney | H05K 7/1418 |
| 2011/0150568 A1 * | 6/2011 | Deisenhofer | H05K 7/1404 403/374.1 |
| 2016/0353597 A1 | 12/2016 | Gilmore | |
| 2018/0320718 A1 * | 11/2018 | Do | F16B 2/14 |

OTHER PUBLICATIONS

Calmark Series 260—"Card-Lok" Retainer (Cold Plate) specs, www.calmark.com, pp. 36 & 37, believed to be sold in the U.S. before Dec. 2017.

Wakefield-vette Wedgelock Data Sheet, .260x.225 profile, C-426D-DS, rev 02/13, 2 pp.

Wakefield-vette Wedgelock Data Sheet, .260x.250 profile, C-426C-DS, rev 08/13, 2 pp.

* cited by examiner

WEDGE CLAMP FOR CIRCUIT BOARD

CROSS-REFERENCE TO RELATED APPLICATIONS

This application claims priority from U.S. Provisional Application No. 62/792,001, filed on Jan. 14, 2019, the entirety of which is hereby fully incorporated by reference herein

BACKGROUND

This disclosure relates to structures to mount printed circuit boards, cards, and other electronic components within packaging to support, enclose, and/or remove excess heat therefrom during use. Removable wedge clamps to frictionally retain components within with respect to rigid housings are well known. Often with extended times in use the wedge clamps may become set in an expanded condition due to the accumulation of dust, debris, environmental factors, or other reasons. It is often difficult to release the wedge clamps when replacement or inspection of the components is desired.

BRIEF SUMMARY

A first representative embodiment of the disclosure is provided. The embodiment includes a releasable clamping device. The device includes first, second, third, and fourth wedge members that are aligned between a first configuration where an upper surface of the second and fourth wedge members are aligned through a plane with an upper surface of one or both of the first and third wedge members, and can be aligned in a second configuration where the upper surface of the second and fourth wedge members are each vertically offset from the upper surfaces of the first and third wedge members. The first wedge member comprises a lower surface that is opposite from the upper surface and a first end face that defines an oblique surface with respect to upper surface of the first member, that is disposed at a first angle with respect to the upper surface of the first member, the first wedge member further comprises a bore therethrough between the upper surface and an opposite lower surface. The second wedge member comprises a lower surface that is opposite from the upper surface and opposite first and second end faces disposed at opposite ends thereof, wherein the second end face contacts and is disposed to slide with respect to the first end face of the first wedge member, the second wedge member comprises a cavity that extends blindly from the upper surface. The third wedge member comprises a lower surface that is opposite from the upper surface and opposite first and second end faces disposed at opposite ends thereof, wherein the second end face of the third wedge member contacts and is disposed to slide with respect to the first end face of the second wedge member, the third wedge member comprises a cavity that extends blindly from the upper surface. The fourth wedge member comprises a lower surface that is opposite from the upper surface and opposite first and second end faces disposed at opposite ends thereof, wherein the second end face of the fourth wedge member contacts and is disposed to slide with respect to the first end face of the third wedge member, wherein the fourth wedge member comprises a cavity that extends blindly from the upper surface. A carrier is provided upon which bottom surfaces of the first and third wedge members slidably rest upon, and when in the first configuration the bottom surfaces of the second and fourth wedge members additionally slidably rest upon, wherein the carrier comprises an ramp surface upon which the first end face of the fourth wedge member contacts and is disposed to slide with respect to the ramp surface of the carrier. The carrier further comprises a projection that extends within the bore through the first wedge member.

Advantages of the present disclosure will become more apparent to those skilled in the art from the following description of the preferred embodiments of the disclosure that have been shown and described by way of illustration. As will be realized, the disclosed subject matter is capable of other and different embodiments, and its details are capable of modification in various respects. Accordingly, the drawings and description are to be regarded as illustrative in nature and not as restrictive.

BRIEF DESCRIPTION OF THE DRAWINGS

FIG. 1 is a perspective view of a releasable retaining device and carrier suitable to retain a printed circuit board within a housing with a frictional connection, depicting the device in a compact (release) configuration (detail C of FIG. 3*a*).

DETAILED DESCRIPTION OF THE DRAWINGS AND THE PRESENTLY PREFERRED EMBODIMENTS

Turning now to FIGS. 1-8, a retaining device 3000 is provided. The retaining device 3000 may be configured to releasably secure a movable component to a rigid structure. In some embodiments, the retaining device 3000 may be configured to rigidly support a printed circuit board (PCB) 5000, which may be enclosed within a cover 3300, to form, for example, an avionics package. In some embodiments, the cover 3300 may be provided to protect the printed circuit board from environmental factors, such as rain, humidity, or temperature cycles. The cover 3300 may also perform the function of providing thermal management for the removal of heat from the PCB. In some embodiments, the cover 3300 may fully enclose the printed circuit board when disposed therein, while in other embodiments the rigid housing may simply provide rigid alignment to the printed circuit board.

Figure 3:
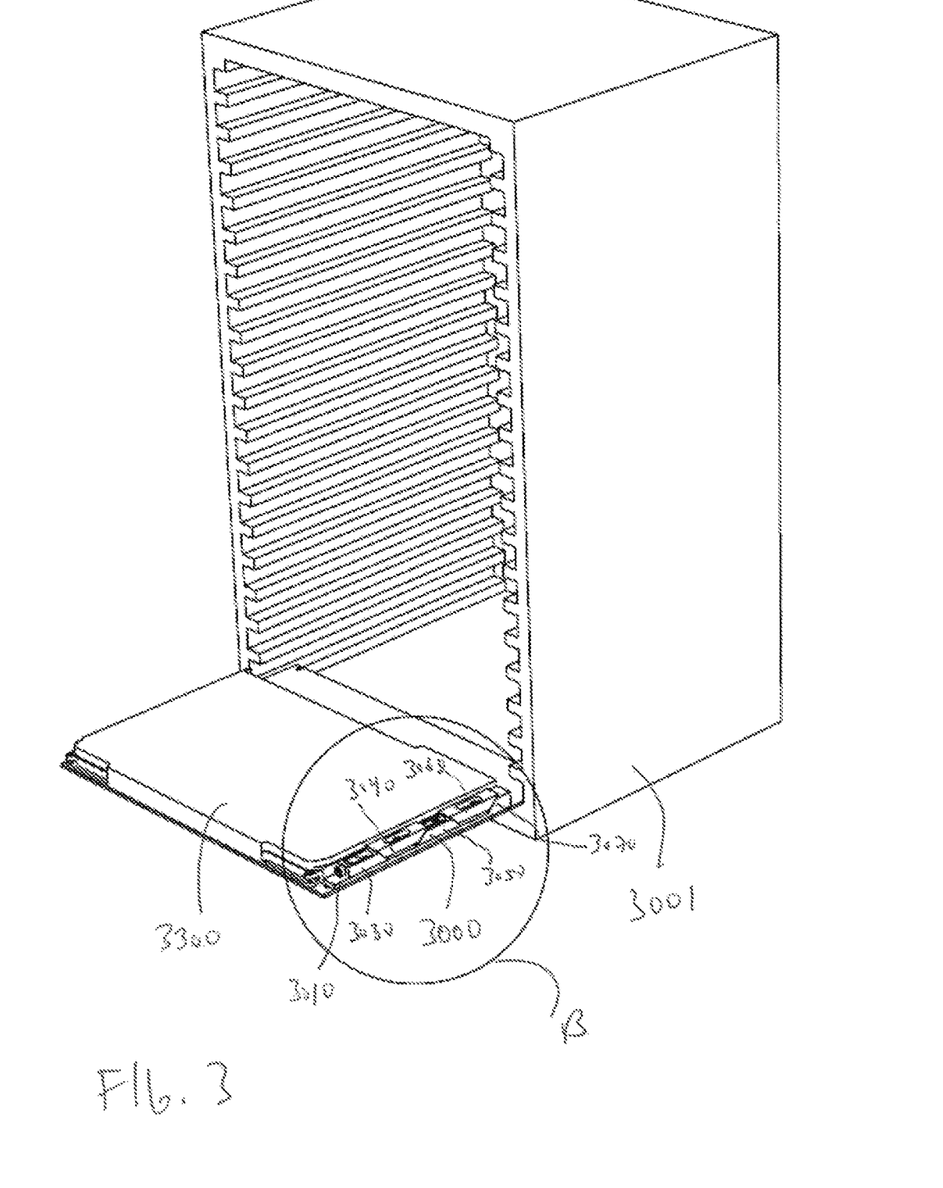
FIG. 3 is the retaining device and carrier of FIG. 1 in a locking configuration, showing the printed circuit board and associated packaging disposed with upon the carrier and with the assembly aligned to be slid into a housing.
Figure 3A:
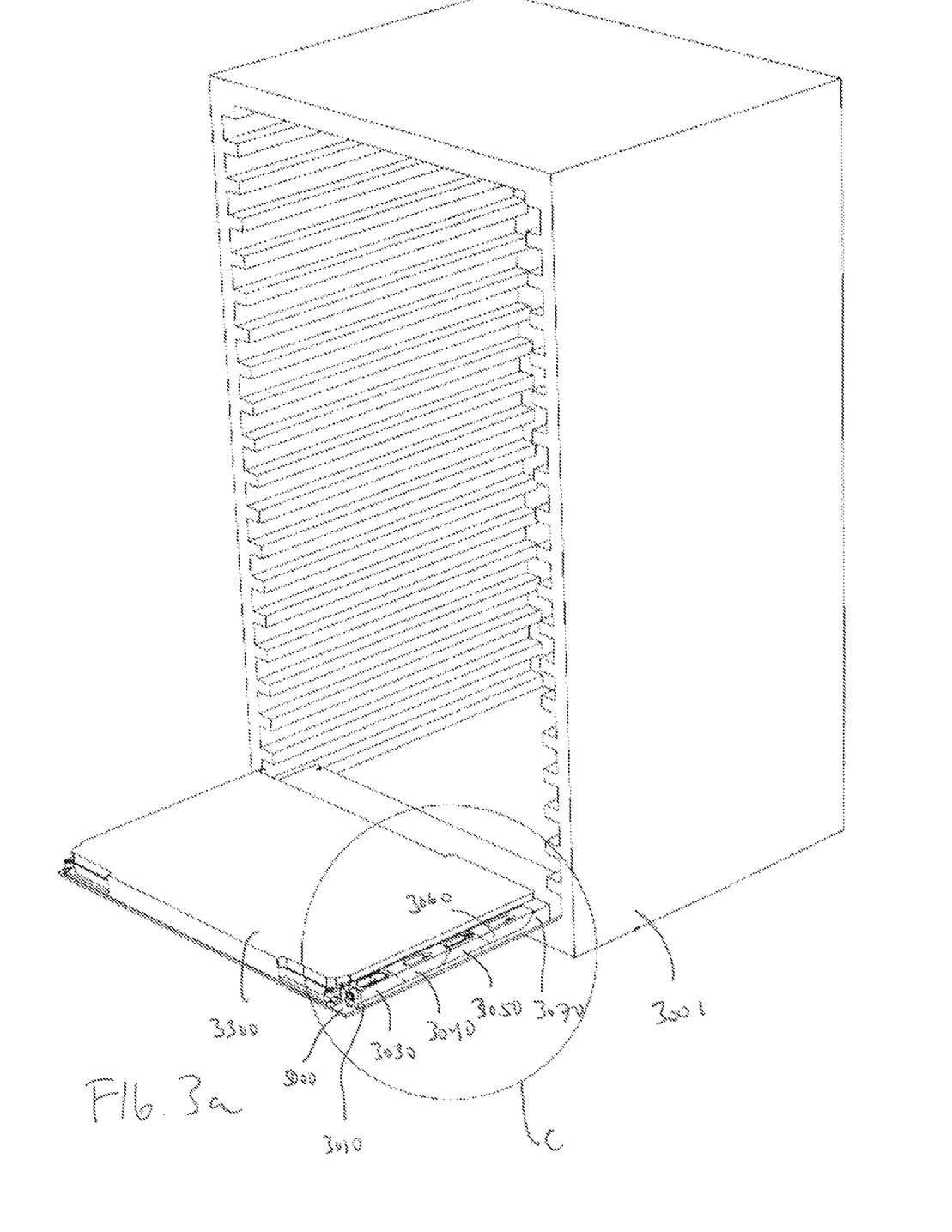
FIG. 3*a* is the view of FIG. 3 showing the retaining device in a release configuration.
Figure 4:
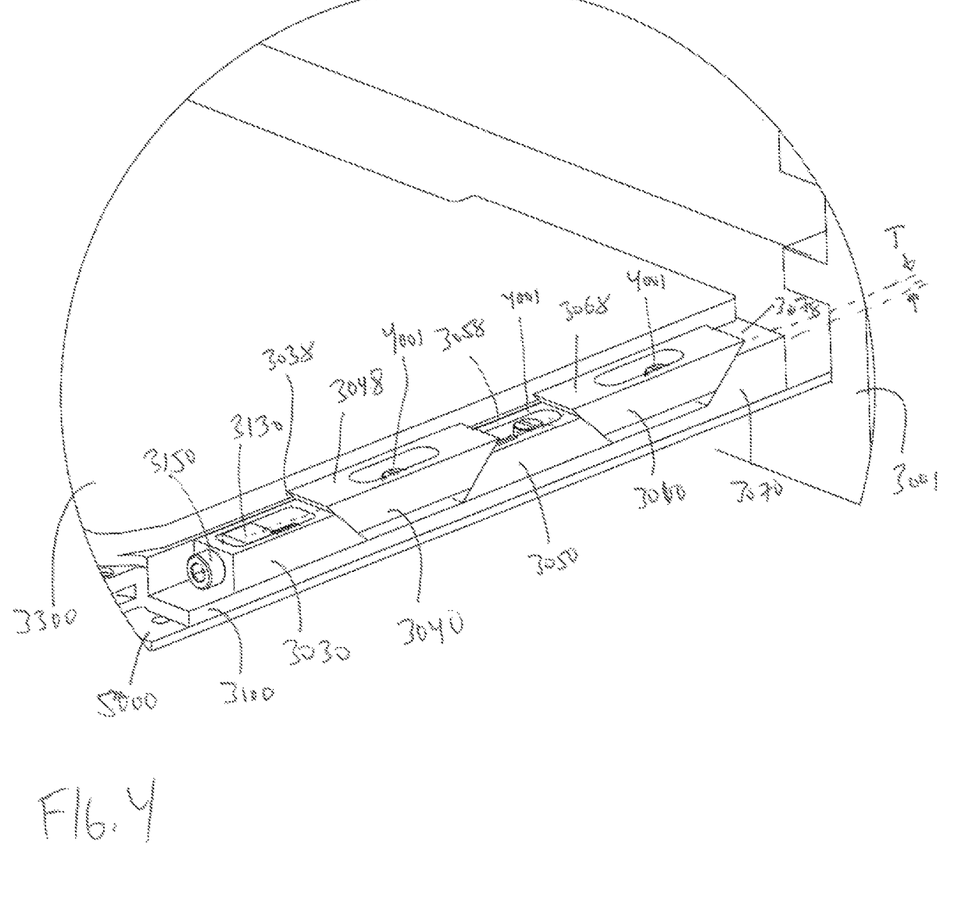
FIG. 4 is detail view of the retaining device of FIG. 3, depicting the device in the locking configuration (detail B of FIG. 3).

The retaining device 3000 is configured for long term engagement to retain a printed circuit board, normally within a cover (but not required to be within a cover) (or similar structure) fixed with respect to a rigid housing 3001 (i.e. when the cover 3300, carrier 3010 (discussed below) and the retaining device (collectively the assembly 3400, FIG. 1) is slid within the rigid housing 3001, and the retaining device is transferred to the locking configuration (FIGS. 3, 4). The assembly 3400 is releasable from the rigid housing 3001 when the retaining device 3000 is moved to the release configuration (FIG. 1, 3*a*), which allows the assembly 3400 to be slid out of the rigid housing 3001. The term rigid housing 3001 as used herein should be broadly understood by one of ordinary skill in the art that reviews this specification to include any structure that is capable of retaining a removable structure, and may be an enclosure, a heat transfer surface (cold plate, finned structure, or the like) or another component. Likewise, the term printed circuit board as used herein should be broadly understood by one of ordinary skill in the art that reviews this specification to include any structure that may be desired to be fixed within a rigid housing, yet capable of being removed for replacement or repair.

Figure 2:
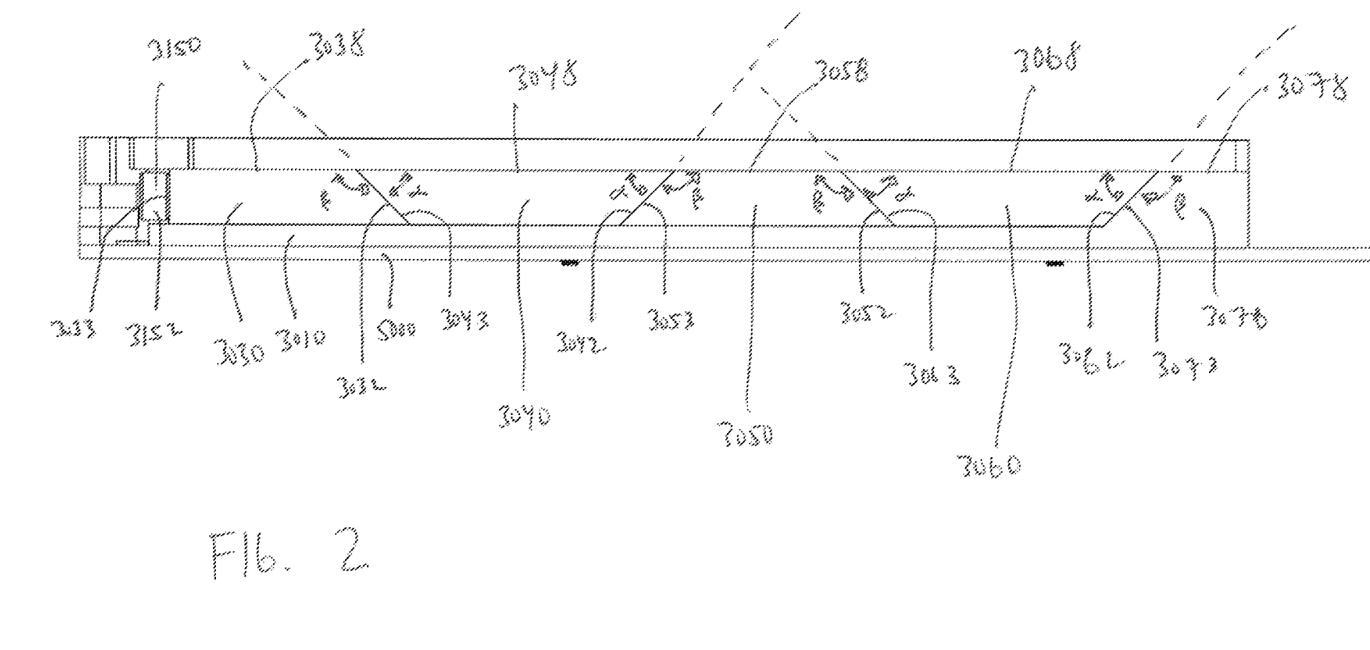
FIG. 2 is a front view of the releasable retaining device and carrier of FIG. 1.
Figure 5:
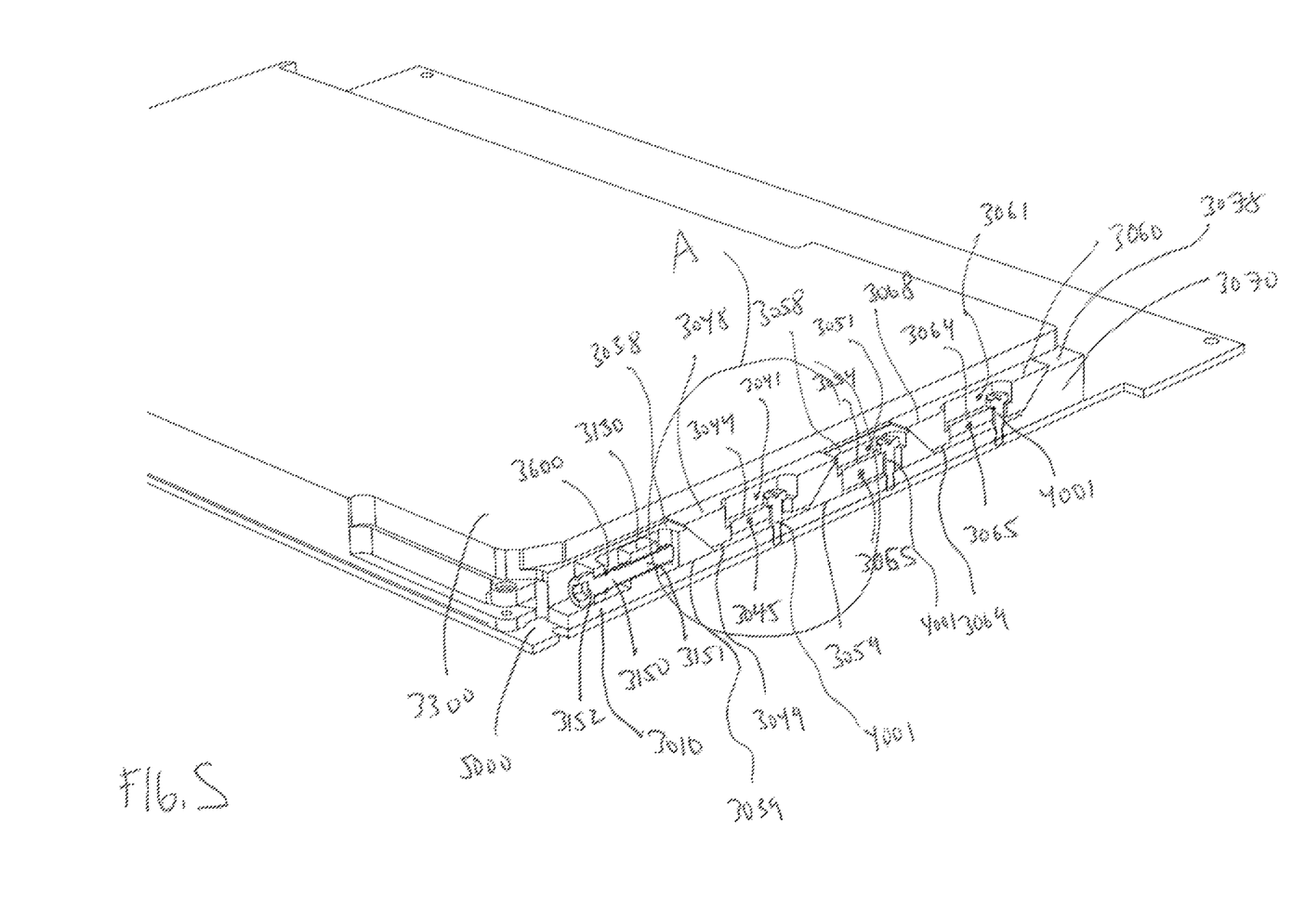
FIG. 5 is a cross-sectional view of FIG. 4 with the housing removed.
Figure 6:
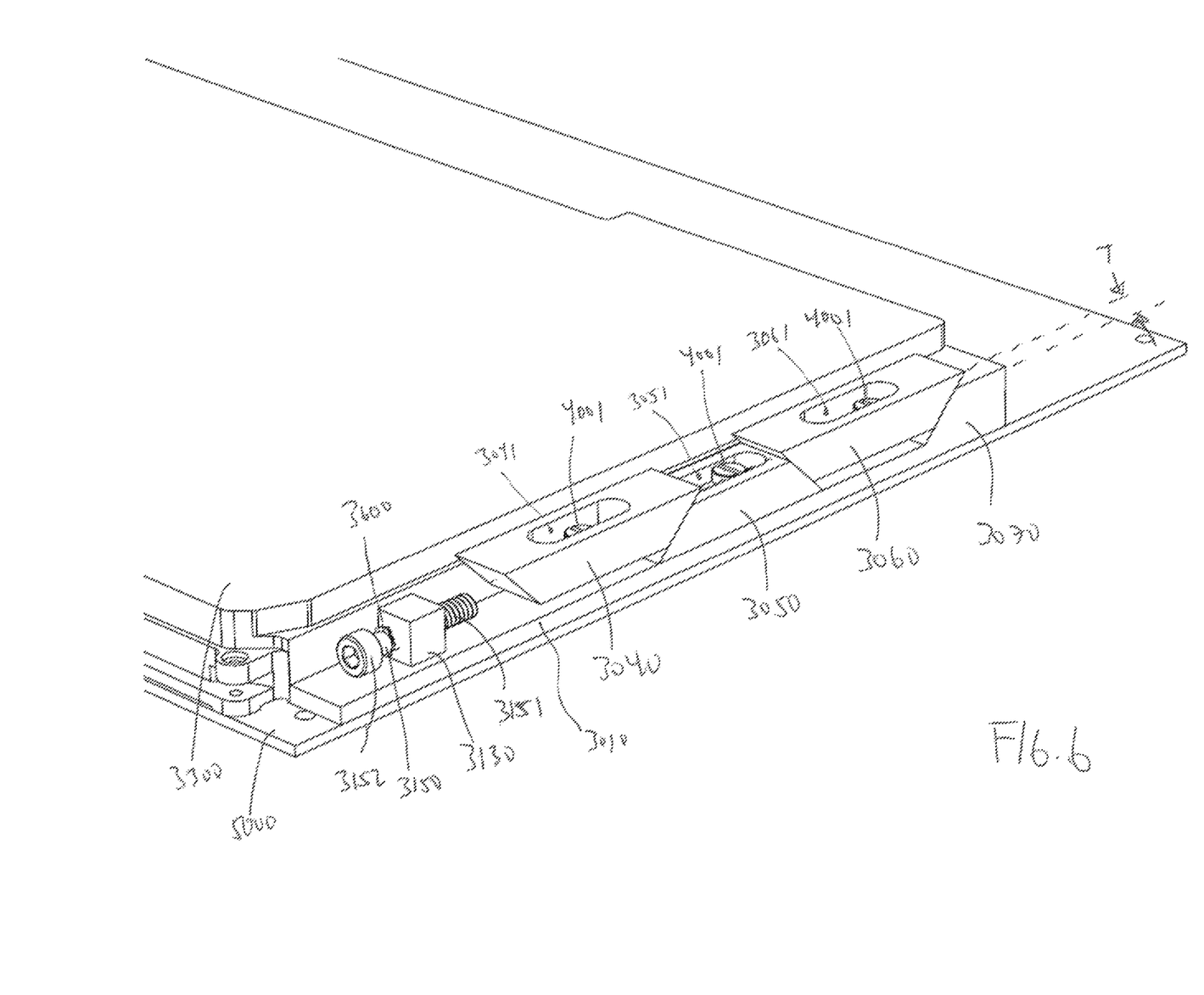
FIG. 6 is another perspective view of the retaining device and carrier of FIG. 4 in the locking configuration with the first wedge member and the housing removed.
Figure 6A:
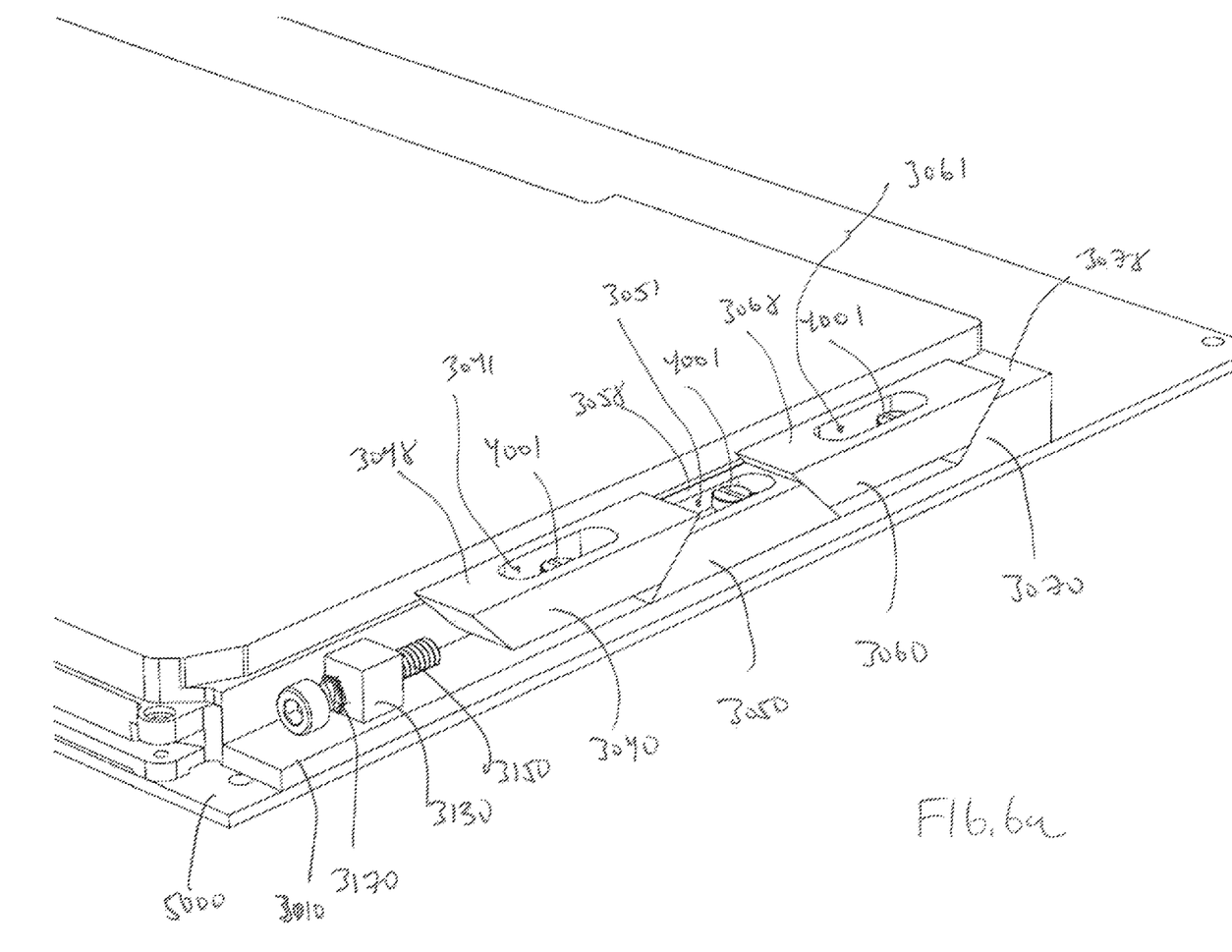
FIG. 6*a* is a modified view of FIG. 6 depicting a spring between the upon the shaft of the input and bearing against the projection (and also bears against a wall forming the bore of the first wedge member—not shown in this figure).

The retaining device 3000 is best shown in FIGS. 1 and 2, and is adjustable between a release (relaxed) configuration (FIGS. 1, 2) and an expanded (locking) configuration (FIGS. 3, 5, 6). In the release configuration, the retaining device 3000 is in a narrowed, relaxed, alignment (i.e. a narrow width between the "top" surfaces of the device and the "bottom" surfaces of the device). The use of relative terms "top" and "bottom" are relative terms and depending upon the orientation of the retaining device 3000 in the environment, the "top" surfaces as defined herein can be oriented at a bottom of the device (as the device is oriented with respect to other structures and in the field of gravity) and the "bottom" surfaces can be oriented at a top of the device. The "top" surface is defined herein to be the surfaces of each component that faces in the direction W (FIG. 1) and the "bottom" surface is defined as the surfaces of each component that face in the opposite direction X. The height is defined as the distance between the top and bottom surfaces.

The retaining device 3000 includes multiple wedge members and an input 3150 that urges the first wedge member 3030 to slide with respect to the carrier 3010 toward and away from the ramp surface 3073 of the carrier 3010. As the first wedge member 3030 is urged to slide, the remaining wedge members are also urged to translate with respect to each other and with respect to the carrier. The movement of the wedge members with respect to the carrier 3010 causes the retaining device 3000 to transfer the device between the release configuration and the locking configuration. In some embodiments, some of the wedge members are urged to move in the direction W with respect to the carrier 3010 and other wedge members maintain contact and slide along a flat surface 3011 of the carrier 3010 as the input 3150 is moved in a first way (such as rotating an input 3150 in a first rotational direction, Z) (which increases the overall height of the retaining device 3000 between the top surfaces of the wedge members that are translated in the direction W and the bottom surfaces of the wedge members that do not translate in the direction W as the input is moved—such that the top surfaces 3048, 3068 of the moving wedge members 3040, 3060 are raised above the top surfaces 3038, 3058 of the non raising wedge members 3030, 3050 (and the top surface 3078 of the ramp surface 3073) by a distance T, FIGS. 4, 6, 7). When the input 3150 is moved in a second way (such as rotating the input 3150 in the opposite direction Y) some wedge members translate with respect to the other wedge members and the carrier 3010 in the direction X until the top surfaces of all of the wedge members are substantially aligned along a single plane (which decreases the overall height of the retaining device 3000) and the bottom surface of each wedge member contacts the flat surface 3011 of the carrier 3010.

In some embodiments, when the retaining device 3000 is in the first, relaxed state or configuration, the top surfaces of all of the wedges, and in some embodiments the top surfaces of the ramp member 3070 upon the carrier 3010 are aligned along substantially the same plane and the bottom surfaces of all wedges rest upon the carrier 3010. When the retaining device 3000 is in a second expanded (locking) configuration the top surfaces of the wedge members that move upward in the direction W (in FIG. 4 depicting wedge members 3040 and 3060 being such wedge members) are aligned through a plane that is offset vertically from (i.e. in the direction W) and in some embodiments parallel with the plane through the top surfaces of the remaining wedge members (wedge members 3030, 3050, and the top surface of the ramp member 3070), and likewise a plane through the bottom surfaces of the moved wedge members is offset apart from and parallel with a plane through the bottom surfaces of the fixed components. In the expanded (locking) configuration, the bottom surfaces 3039, 3059 of the first and third wedge members 3030, 3050 remain in contact with the carrier 3010 while the bottom surfaces 3049, 3069 of the second and fourth wedge members 3040, 3060 are raised away from and spaced apart from the carrier 3010 (while the first end face 3062 of the fourth wedge member 3060 remains in contact with the ramp surface 3073 of the carrier 3010. In order to translate from the relaxed position to the locked position, the first and third wedge members 3030, 3050 slide along the carrier in a direction toward the ramp surface 3073 as urged by movement of the input 3150, as discussed below.

In a representative embodiment specifically disclosed herein, the retaining device 3000 may include four wedge members (3030, 3040, 3050, 3060) that are longitudinally aligned along a surface 3011 of the carrier 3010. While in the embodiment depicted and described in this specification includes four wedge members (which are disposed in concert with an ramp member 3070 upon the carrier 3010) one of ordinary skill in the art with a thorough review of the subject specification will readily understand that the device can include less or more wedge members, such as 3, 4, 6, or 7 wedge members so long as the device has one or more wedge members that are free to move in the directions W and X with respect to the carrier 3010 and one or more wedge members that remain in contact with the carrier based upon the motion of the input 3150 by a user. One of ordinary skill would be able to construct such a retaining device with a differing number of wedge members (and with different relative sizes and shapes than the components depicted herein) without undue experimentation.

In a preferred embodiment, the retaining device 3000 includes a first wedge member 3030, a second wedge member 3040, a third wedge member 3050, a fourth wedge member 3060 all of which rest upon a surface of a carrier 3010.

The first wedge member 3030 includes a top surface 3038 and an opposite bottom surface 3039, which slidably rests upon the carrier 3010. The first wedge has a first end face 3032 and a second end face 3033. As discussed in greater detail below, the first end face 3032 is disposed at an oblique angle with respect to a plane through the top surface 3038 of the first wedge member. The second end face 3033 is disposed on the opposite end of the first wedge member 3030 from the first end face 3032, and an input 3150 extends out of the first wedge member 3030 from the second end face 3033 such that a user can manipulate the input 3150, which causes the retaining device 3000 to transfer between a release configuration (FIG. 1) and a locking configuration (FIG. 4).

In some embodiments, the input 3150 may be a threaded member with a head 3152 that extends out of the second end face 3033 of the first wedge member, with a threaded shaft 3151 extending into a bore 3031 within the first wedge member 3030. The bore receives a projection 3130 that extends from the carrier 3010 and the shaft is threaded into a tapped hole in the projection 3130.

In some embodiments, a retaining ring 3600 (FIG. 6) is disposed around the shaft 3151 of the threaded member and disposed within the bore 3031 such that the retaining ring 3600 bears against a wall defining the bore 3031. The head 3152 of the fastener bears against the wall of the first wedge member 3030 through which the shaft of the threaded member extends. The combination of the head 3152 of the fastener and the retaining ring 3600 causes the first wedge member 3030 to translate as the fastener is rotated. When the input 3150 is rotated in the direction Z, the head 3152 pushes against the first wedge member 3030 to cause it to slide toward the ramp 3073, and when the input 3150 is rotated in the opposite direction Y, the retaining ring 3600 pushes against the first wedge member 3030 in the opposite linear direction away from the ramp 3073.

In other embodiments, the retaining ring 3600 may be fixed with respect to the first wedge member 3030 (and fixed with respect to the shaft 3151 of the threaded member). During assembly, the retaining ring 3600 may be slid through a slot in the first wedge member 3030 to allow the retaining member 3600 to be positioned such that the shaft 3151 of the threaded member extends through the retaining member 3600 as the shaft is inserted into hole toward the bore 3031 and ultimately into the projection 3130. The shaft 3151 may include a narrowed portion to lockingly receive the retaining ring such that the retaining ring, and therefore the first wedge member 3030 slides as the input 3150 is rotated by the user.

In another embodiment, a spring 3170 (FIG. 6a) is disposed within the bore 3031 and around the shaft of the threaded member. The spring is a compression spring and is disposed between the projection and a surface of the first wedge member 3030 within the bore 3031 that is proximate to the second end face 3033 such that the spring 3170 urges the first wedge member away from the second wedge member 3040, discussed below. Operation of the input 3150 will be discussed in further detail below.

The second wedge member 3040 includes a top surface 3048 and an opposite bottom surface 3049 which in the release configuration rest upon the carrier 3010 and in the locking configuration is spaced from the carrier 3010 (as the second wedge member 3040 is lifted in the direction W). The second wedge member includes a first end face 3042 and an opposite second end face 3043. The second end face 3043 makes surface to surface contact with, and is capable of sliding with respect to, the first end face 3032 of the first wedge member 3030 and the first end face 3042 makes surface to surface contact with, and is capable of sliding with respect to, the second end face 3053 of the third wedge member 3050. In some embodiments, the second wedge member 3040 is shaped as a trapezoid, with the top surface 3048 being parallel to the bottom surface 3049 and larger than the bottom surface 3049.

The second wedge member 3040 includes a blind cavity 3041 that extends from the top surface 3048 toward the bottom surface 3049. The bottom of the blind cavity 3041 forms a ledge 3044. A slot 3045 extends from the ledge 3044 to the bottom surface 3049 of the second wedge member 3040. The slot 3045 is provided to allow for relative longitudinal motion of the second wedge member 3040 with respect to the carrier 3010. A fastener, such as a screw 4001 (FIGS. 2, 5, 7, and 8), is disposed such that a shaft 4001a of the fastener extends through the slot 3045 and is fixed within a hole (which may be tapped in embodiments where the fastener is a screw) to fix the fastener with respect to the carrier 3010. The head 4001b of the fastener is disposed within the blind cavity 3041 such that when the head is within the blind cavity (and does not extend above the top surface 3048 of the second wedge member) when the retaining device 3000 is in both the release and locking positions. Accordingly, the depth of the cavity 3041 is at least as deep as the extent of possible motion of the second wedge member 3040 in the direction W away from a position where the bottom surface 3049 contacts the carrier 3010 plus the thickness of the head 4001b of the fastener 4001.

A spring 4002 is disposed between the head 4001b of the fastener 4001 and the ledge 3044, which biases the second wedge member 3040 downward and toward the carrier 3010, to urge the retaining device 3000 toward the release position.

In some embodiments, the fourth wedge member 3060 is the same as the second wedge member 3040. In other embodiments, the fourth wedge member 3060 may be different from the second wedge member 3040 in design and/or operation.

The second end face 3043 makes surface to surface contact with the first end face 3032 of the first wedge member 3030, and as the retaining mechanism transitions between the release and locking configurations, the second end face 3043 and the first end face 3032 slide with respect to each other.

The third wedge member 3050 may be trapezoidal and includes a top surface 3058 and a bottom surface 3059, and a first end surface 3052 and an opposite second end surface 3053. In embodiments where the third wedge member is trapezoidal, the bottom surface 3059 is larger than the top surface 3058. The first end face 3052 makes surface to surface contact with the second end face 3063 of the fourth wedge member 3060, with the two end faces sliding along each other as the input 3150 is moved. The second end face 3053 makes surface to surface contact with the first end face 3042 of the second wedge member 3040, with the two end faces sliding along each other as the input 3150 is moved.

Similar to the second wedge member 3040, the third wedge member 3050 includes a blind cavity 3051 that extends from the top surface 3058 toward the bottom surface 3059. The bottom of the blind cavity 3051 forms a ledge 3054. A slot 3055 extends from the ledge 3054 to the bottom surface 3059 of the third wedge member 3050. The slot 3055 is provided to allow for relative longitudinal motion of the third wedge member 3050 with respect to the carrier 3010 (i.e. in a direction perpendicular to direction W toward or away from the ramp surface 3073. A fastener, such as a screw 4001 (FIGS. 2, 5, 7, and 8), is disposed such that a shaft 4001a of the fastener extends through the slot 3055 and is fixed within a hole (which may be tapped in embodiments where the fastener is a screw) to fix the fastener with respect to the carrier 3010. The head 4001b of the fastener is disposed within the blind cavity 3051 such that when the head is within the blind cavity (and does not extend above the top surface 3058 of the third wedge member) when the retaining device 3000 is in both the release and locking positions.

In some embodiments, a spring 4002 is disposed between the head 4001b of the fastener 4001 and the ledge 3054, which biases the third wedge member 3040 downward and toward the carrier 3010, to urge the third wedge member to maintain contact with the carrier 3010.

The carrier 3010 is best shown in FIG. 6. In some embodiments, the carrier 3010 is fixed to the cover 3300, either based upon two separate components that are mechanically or otherwise fixed together, or in some embodiments, the carrier 3010 is formed monolithically with the cover 3300. The carrier 3010 may be fixed to the PCB 5000 with one or more fasteners, latches, or with other mechanical structures, while in other embodiments the cover 3300 maybe fixed to the PCB.

The carrier 3010 includes a flat surface 3011 upon which the first, second, third, and fourth wedge members 3030, 3040, 3050, 3060 rest and move upon or with respect to. The carrier 3010 further supports an item to be supported, such as a printed circuit board and associated protective housing and associated connections thereto. The flat surface 3011 supports projection 3130 that extends upwardly from the flat surface and, as discussed above, is disposed within the bore 3031 in the first wedge member 3030. The projection 3130 is fixed with respect to the carrier. In some embodiments, the projection 3130 is formed monolithically with the carrier 3010 (such as the carrier 3010 and projection 3130 are formed from the initial workpiece—e.g. cast together or machined), while in other embodiments the projection 3130 may be a separate component that is fixed to the flat surface 3011 of the carrier 3010.

The carrier 3010 further comprises a ramp surface 3073 and associated support 3070 that extends upwardly from the flat surface 3011, and forms an angle (such as an obtuse angle β with respect to a top surface 3078 of the support. The ramp surface 3073 and associated support is fixed to the flat surface 3011 and may either be monolithically formed with the carrier or may be fixed to the carrier 3010 (similar to the description of the projection 3130, above).

Figure 7:
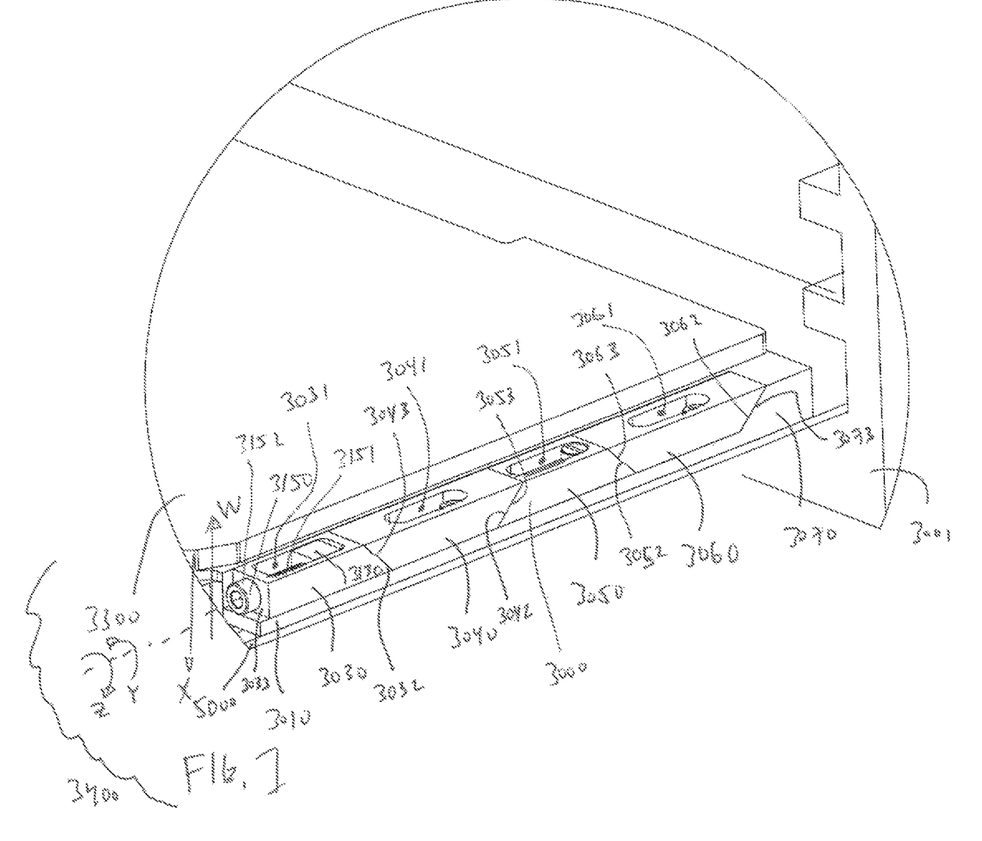
FIG. 7 is a front view of the retaining device and carrier of FIG. 1 in the locking position.
Figure 8:
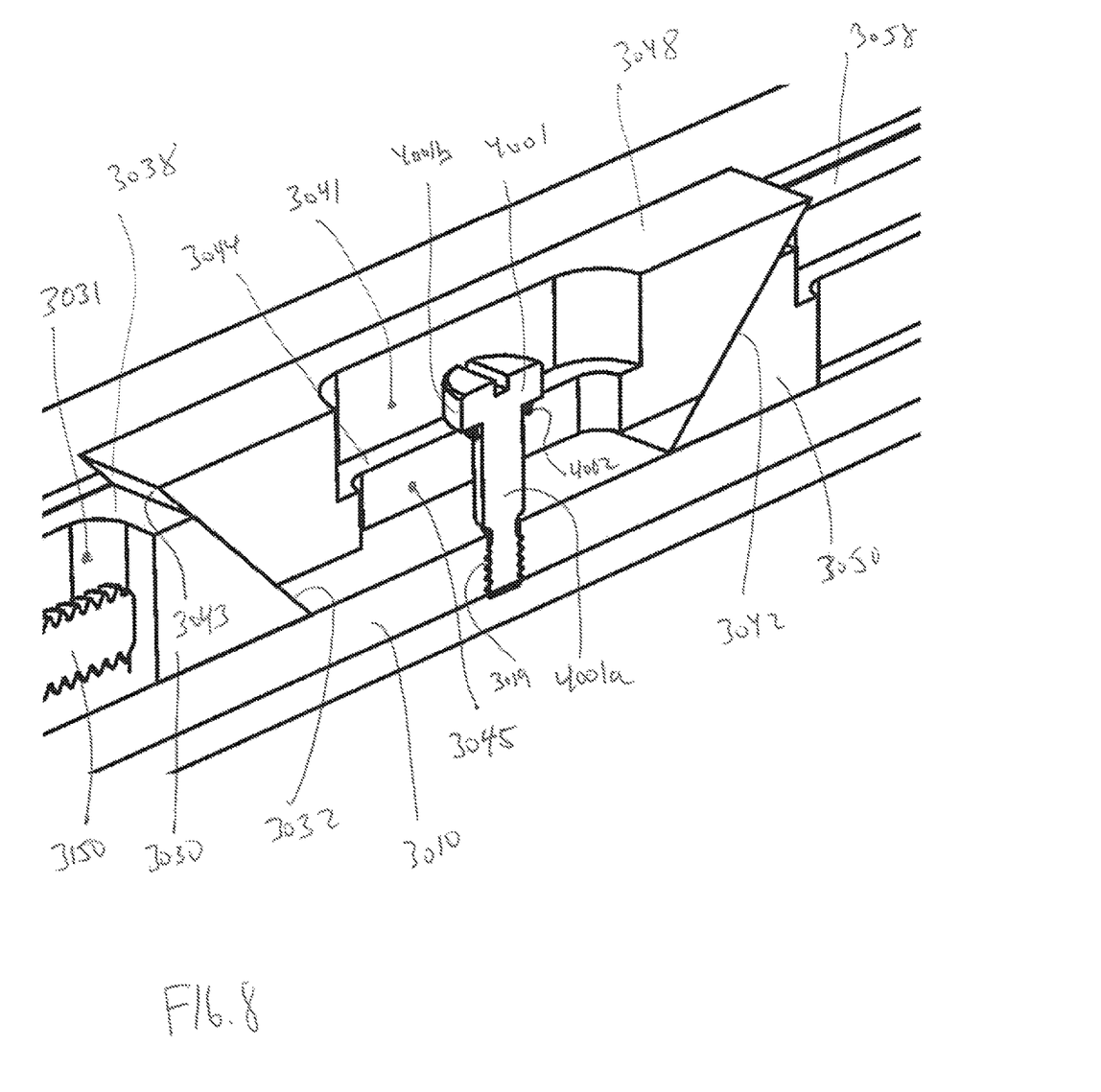
FIG. 8 is a view of detail A of FIG. 5.
Figure 11:
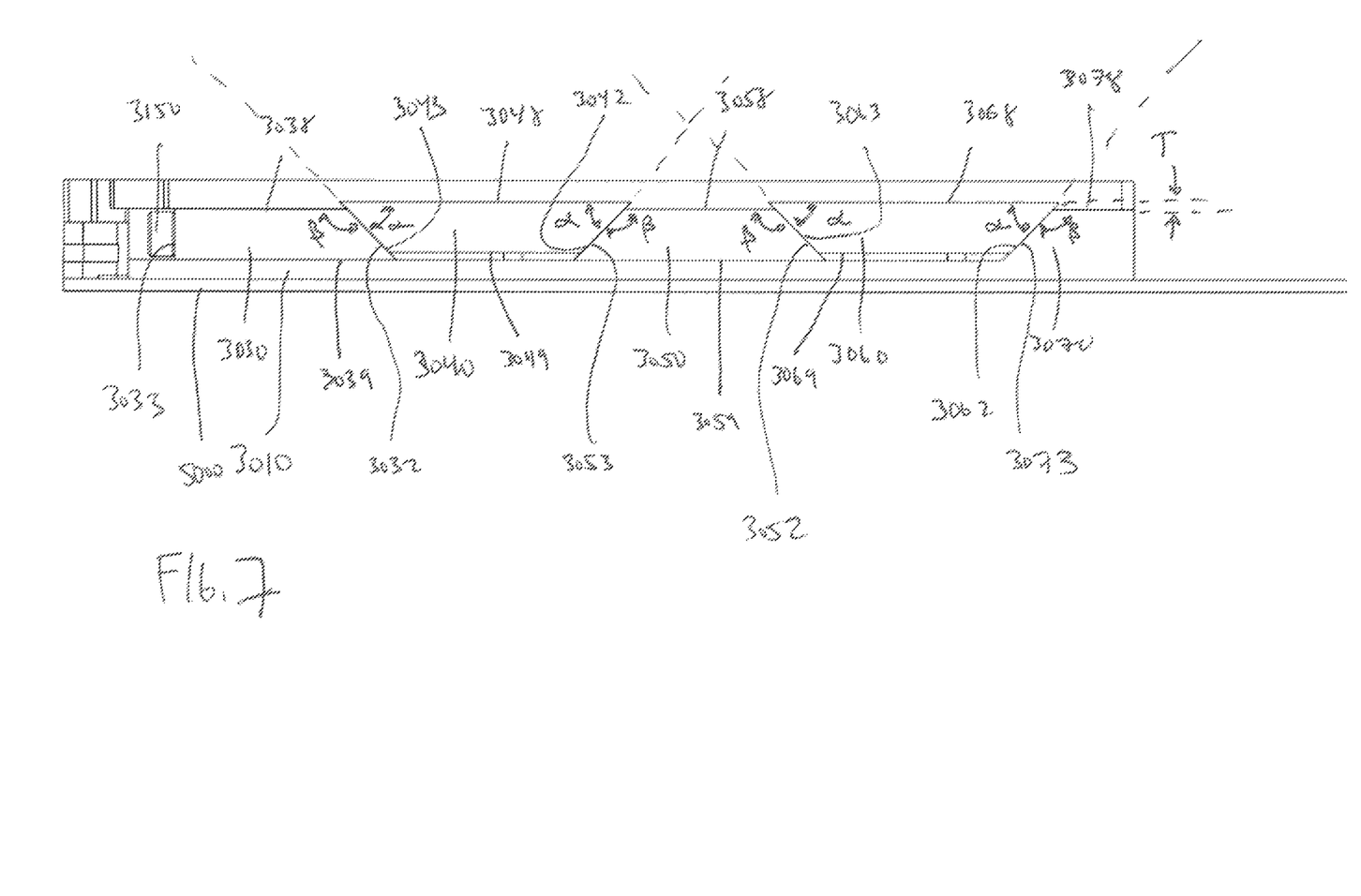

As best shown in FIGS. 2 and 7, the first end face 3032 of the first wedge member 3030 is disposed at a first oblique angle with respect to a plane through the top surface 3038 of the first wedge member. The second end face 3043 of the second wedge member 3040 is disposed at a second oblique angle with respect to a plane through the top surface 3048 of the second wedge member 3040. In this embodiment, the second oblique angle is a first angle α and is an obtuse angle, and the second oblique angle is a second angle β, which is an acute angle. In this embodiment, the first angle α and the second angle β are supplementary angles.

In some embodiments, the first angle α may be 135 degrees, or about 135 degrees, with the second angle β being 45 degrees or about 45 degrees. The term "about" is specifically defined herein to mean the reference value notes plus or minus 5 percent of the reference value. In other embodiments, the first angle α may be within a range of about 105 degrees to about 165 degrees (such as 120, 125, 130, 135, 140, 145, 150 degrees), inclusive of all angles within this range, while the second angle β may be within a range of about 15 degrees to about 75 degrees (such as 30, 35, 40, 45, 50, 55, 60 degrees) inclusive of all angles within this range. One of ordinary skill in the art will understand that by varying the angles α and β, the amount of vertical sliding motion of the second and fourth wedge members 3040, 3060 for a given input translation of the first wedge member 3030 will differ. For example, with steeper first acute angles (e.g. greater than the exemplary 45 degrees) there is greater vertical motion (directions W or X) for a given sliding motion of the first wedge member 3030 (as urged by motion of the input 3150 (and in embodiments where the first wedge member is biased by the spring 3170 the release of the input allowing biasing force of the spring 3170 to slide the first wedge member 3030 away from the ramp surfaced 3073)). This greater vertical motion for a given input motion may be desired or undesired for a particular application and one of ordinary skill in the art after a thorough review and understanding of this specification and figures would be able to develop a desired device with a desired performance without undue experimentation.

In some embodiments the transition between the first and second wedge members 3030, 3040, the transition between the second and third wedge members 3040, 3050, the transition between the third and fourth wedge members 3050, 3060, and the transition between the fourth wedge member and the ramp surface 3073 of the carrier are each in the same manner, i.e. with surface to surface contact where the end faces of the two contacting wedge members that are configured to slide with respect to each other (and in the case of the fourth wedge member 3060 and the ramp surface 3073 of the carrier 3010—the first end face 3062 of the fourth wedge member 3060 slides with respect to the fixed ramp surface 3073 of the ramp member 3070). Similarly, in some embodiments, such as the embodiments depicted in the appended figures, the respective end faces that form an obtuse angle with respect to the top surface of the respective wedge member (and the ramp surface 3073 of the carrier 3010) are each at the first angle α, discussed above, and the respective end faces that form an acute angle with respect to the top surface of the respective wedge member are each formed at the second angle β.

In other embodiments, the interfacing end faces of various neighboring wedge members may be aligned to be supplementary angles with each other, but the specific respective acute and obtuse angles may be different from the angles that are formed by the interfaces of other wedge members. This embodiment may be selected when it is desired to cause the wedge members that move in the direction W when the input 3150 is translated in the locking direction (e.g. the direction Z) at different rates or through different ranges of motion from other moving wedge members. For example, it might be preferred to have a system where wedge members that move in the direction W engage a surface that is not planer, and therefore in order to accommodate the non-planar surface the wedge members should move in the direction W different distances for the same motion of the input 3150. In this embodiment a larger second (acute) angle β and a smaller first (obtuse) angle α would promote increased vertical motion W for a given longitudinal motion (i.e. perpendicular to the direction W and in the direction toward second wedge member 3040 or the ramp surface 3073 of the carrier 3010) as directed by the input 3150. One of ordinary skill in the art with a thorough review of the subject specification and figures would understand how to design a retaining device that could engage a nonplanar surface by varying the relative sizes and shapes of the wedge members (such as with differing angles for various end faces as discussed above) without undue experimentation.

In some embodiments, some or all of the end surfaces of the second through fourth wedge members 3040, 3050, 3060, the first end face 3032 of the first wedge member 3030 and the ramp surface 3073 of the carrier are planer surfaces without any holes therein. These embodiments maximize the surface to surface contact between neighboring wedge members, which maximizes heat transfer therebetween.

While the preferred embodiments of the disclosed have been described, it should be understood that the invention is not so limited and modifications may be made without departing from the disclosure. The scope of the disclosure is defined by the appended claims, and all devices that come within the meaning of the claims, either literally or by equivalence, are intended to be embraced therein.

The invention claimed is:

1. A releasable clamping device, comprising:

first, second, third, and fourth wedge members that are aligned between a first configuration where an upper surface of the second and fourth wedge members are aligned through a plane with an upper surface of one or both of the first and third wedge members, and can be aligned in a second configuration where the upper surface of the second and fourth wedge members are each vertically offset from the upper surfaces of the first and third wedge members;

wherein the first wedge member comprises a lower surface that is opposite from the upper surface and a first end face that defines an oblique surface with respect to upper surface of the first member, that is disposed at a first angle with respect to the upper surface of the first member, the first wedge member further comprises a bore therethrough between the upper surface and the opposite lower surface, wherein the second wedge member comprises a lower surface that is opposite from the upper surface and opposite first and second end faces disposed at opposite ends thereof, wherein the second end face contacts and is disposed to slide with respect to the first end face of the first wedge member, the second wedge member comprises a cavity that extends blindly from the upper surface;

wherein the third wedge member comprises a lower surface that is opposite from the upper surface and opposite first and second end faces disposed at opposite ends thereof, wherein the second end face of the third wedge member contacts and is disposed to slide with respect to the first end face of the second wedge member, the third wedge member comprises a cavity that extends blindly from the upper surface;

wherein the fourth wedge member comprises a lower surface that is opposite from the upper surface and opposite first and second end faces disposed at opposite ends thereof, wherein the second end face of the fourth wedge member contacts and is disposed to slide with respect to the first end face of the third wedge member, wherein the fourth wedge member comprises a cavity that extends blindly from the upper surface, a carrier upon which bottom surfaces of the first and third wedge members slidably rest upon, and when in the first configuration the bottom surfaces of the second and fourth wedge members additionally slidably rest upon, wherein the carrier comprises a ramp surface upon which the first end face of the fourth wedge member contacts and is disposed to slide with respect to the ramp surface of the carrier, wherein the carrier further comprises a projection that extends within the bore through the first wedge member.

2. The releasable clamping device of claim 1, wherein the second end face of the second wedge member defines an oblique surface and extends at a second angle with respect to the upper surface of the second wedge member, wherein the second angle is a supplementary angle to the first angle.

3. The releasable clamping device of claim 2, wherein the second end face of the third wedge member defines an oblique surface and extends at a third angle with respect to the upper surface of the third wedge member, wherein the third angle is a supplementary angle to an angle of the first end face of the second wedge member with respect to the upper surface of the second wedge member, and wherein the second end face of the fourth wedge member defines an oblique surface and extends at a fourth angle with respect to the upper surface of the fourth wedge member, wherein the fourth angle is a supplementary angle to an angle of the first end face of the third wedge member with respect to the upper surface of the third wedge member.

4. The releasable clamping device of claim 2 wherein the first angle is about 135 degrees and the second angle is about 45 degrees.

5. The releasable clamping device of claim 2, wherein the first angle is within a range of about 105 degrees to about 165 degrees.

6. The releasable clamping device of claim 1, wherein the second, third, and fourth wedge members each include a slot that extends from a bottom ledge of the respective cavity to the lower surface of the respective wedge member.

7. The releasable clamping device of claim 6, wherein the carrier receives fasteners through each of the slots in the second, third, and fourth wedge member, wherein a head of each fastener is disposed above the bottom ledge of each cavity, and within the second and fourth wedge members a spring is disposed between the head of the respective fastener and the bottom ledge to bias the second and fourth wedge members toward the first configuration.

8. The releasable clamping device of claim 1, further comprising a rotatable input that extends through a second end face, opposite the first end face, of the first wedge member and extends through the bore and through the projection, wherein rotation of the rotatable input in a first direction urges the first wedge member to slide toward the ramp surface of the carrier, and wherein rotation of the rotatable input in the opposite direction urges the first wedge member to slide away from the ramp surface of the carrier.

9. The releasable clamping device of claim 8, wherein the depth of the cavity on the second and fourth wedge member is just larger than a thickness of the head of the fastener that is disposed within each respective cavity.

10. The releasable clamping device of claim 8, wherein the device is configured to be disposed between a portion of a printed circuit board and a rigid surface, wherein the device fixes the printed circuit board with respect to the rigid surface with a frictional connection when the rotatable input is fully rotated in the first direction, and wherein the device frees the printed circuit board from the rigid case when the rotatable input is rotated in the second direction.

11. The releasable clamping device of claim 1, wherein the first end face of the first wedge member, the first and second end faces of the second wedge member, the first and second end faces of the third wedge member, and the first and second end faces of fourth wedge member and the ramp surface of the carrier are planar surfaces without any holes therein.

12. The releasable clamping device of claim 1, wherein the upper surface of the second wedge member is parallel with the upper surfaces of one or both of the first and third wedge members when the device is in the second configuration.

* * * * *